(12) United States Patent
Chen et al.

(10) Patent No.: US 11,018,132 B2
(45) Date of Patent: May 25, 2021

(54) METHOD OF FABRICATING SEMICONDUCTOR DEVICE

(71) Applicant: UNITED MICROELECTRONICS CORP., Hsin-Chu (TW)

(72) Inventors: Tzu-Ping Chen, Hsinchu County (TW); Chien-Hung Chen, Hsin-Chu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/380,953

(22) Filed: Apr. 10, 2019

(65) Prior Publication Data

US 2019/0237460 A1    Aug. 1, 2019

Related U.S. Application Data

(62) Division of application No. 15/591,031, filed on May 9, 2017, now Pat. No. 10,332,875.

(30) Foreign Application Priority Data

Apr. 6, 2017    (TW) .................................. 106111597

(51) Int. Cl.
| | |
|---|---|
| *H01L 27/06* | (2006.01) |
| *H01L 21/28* | (2006.01) |
| *H01L 29/423* | (2006.01) |
| *H01L 29/66* | (2006.01) |
| *H01L 29/788* | (2006.01) |

(Continued)

(52) U.S. Cl.
CPC .... *H01L 27/0629* (2013.01); *H01L 21/28518* (2013.01); *H01L 21/31144* (2013.01); *H01L 27/11541* (2013.01); *H01L 27/11543* (2013.01); *H01L 29/40114* (2019.08); *H01L 29/42324* (2013.01); *H01L 29/66825* (2013.01); *H01L 29/7881* (2013.01)

(58) Field of Classification Search
None
See application file for complete search history.

(56) References Cited

U.S. PATENT DOCUMENTS

| | | |
|---|---|---|
| 5,378,909 A | 1/1995 | Chang |
| 5,656,840 A | 8/1997 | Yang |

(Continued)

FOREIGN PATENT DOCUMENTS

| | | | |
|---|---|---|---|
| TW | 201637134 A | | 10/2016 |
| TW | 201838152 | * | 10/2018 |

OTHER PUBLICATIONS

Merriam-Webster, Online definition of cover, https://www.merriam-webster.com/dictionary/cover, updated on: Jun. 16, 2018, pp. 1-20., Jun. 16, 2018.

*Primary Examiner* — Hrayr A Sayadian
(74) *Attorney, Agent, or Firm* — Winston Hsu

(57) ABSTRACT

A method for fabricating a semiconductor device includes the steps of providing a semiconductor substrate; forming a tunnel dielectric on the semiconductor substrate; forming a floating gate on the tunnel dielectric; forming an insulation layer conformally disposed on the top surface and the sidewall surface of the floating gate; forming a control gate disposed on the insulation layer and the floating gate; and forming a spacer continuously distributed on the sidewall surfaces of the floating gate and the control gate, where the spacer overlaps portions of the top surface of the floating gate.

7 Claims, 6 Drawing Sheets

(51) Int. Cl.
    *H01L 27/11541*     (2017.01)
    *H01L 27/11543*     (2017.01)
    *H01L 21/311*     (2006.01)
    *H01L 21/285*     (2006.01)

(56) References Cited

U.S. PATENT DOCUMENTS

| | | |
|---|---|---|
| 6,222,227 B1 | 4/2001 | Chen |
| 6,391,716 B1 | 5/2002 | Liou |
| 7,829,931 B2 | 11/2010 | Park |
| 8,980,703 B2 | 3/2015 | Hsu |
| 2008/0093653 A1 | 4/2008 | Park |
| 2012/0018795 A1 | 1/2012 | Chen |

* cited by examiner

METHOD OF FABRICATING SEMICONDUCTOR DEVICE

CROSS REFERENCE TO RELATED APPLICATIONS

The present application is a division of U.S. application Ser. No. 15/591,031, file on May 9, 2017, the disclosure of which is hereby incorporated herein by reference in its entirety.

BACKGROUND OF THE INVENTION

1. Field of the Invention

The present invention relates generally to a method of fabricating a semiconductor device. More particularly, the present invention relates to a method of fabricating a semiconductor device including a nonvolatile memory (NVM).

2. Description of the Prior Art

Nonvolatile memory (NVM) has an ability to retain information without providing an external power supply and is therefore widely used in consumer electronic products. The NVM may be roughly divided into two categories: read-only memory (ROM) and flash memory. In the programming, a voltage can be applied to a control gate in a nonvolatile memory such that electrons in the channel region are injected into a floating gate or charge trapping layer located below the control gate. Since the resistance of the channel region changes depending on whether or not the floating gate or the charge trapping layer has electric charges, the access state of the data can be discriminated by the on/off of the channel region.

With the development of multifunctional chips, semiconductor devices include not only nonvolatile memory, but also logic transistors and/or resistors. Generally, nonvolatile memory in a semiconductor device is typically fabricated in the same wafer along with a logic transistor and/or a resistor. However, the components of the nonvolatile memory and the components of the logic transistor and/or the resistor are usually defined and fabricated separately with different masks and processes, so the above-mentioned process is much more complex than a situation fabricating the non-volatile memory separately. In addition, for the nonvolatile memory currently having the control gate and the floating gate, the coupling ratio thereof still needs to be further enhanced to reduce the operating voltage and power consumption of the nonvolatile memory.

SUMMARY OF THE INVENTION

It is necessary to propose a method of fabricating semiconductor device to solve the problems faced by the prior arts.

According to an embodiment of the present invention, a semiconductor device is disclosed. The semiconductor device includes a semiconductor substrate, a tunnel dielectric disposed on the semiconductor substrate, a floating gate disposed on the tunnel dielectric, a control gate disposed on the floating gate, an insulation layer disposed between the floating gate and the control gate, and a spacer continuously distributed on the sidewall surfaces of the floating gate and the control gate, and the spacer overlaps portions of the top surface of the floating gate.

According to another embodiment of the present invention, a method for fabricating a semiconductor device is disclosed. The method includes the following steps: providing a semiconductor substrate; forming a tunnel dielectric on the semiconductor substrate; forming a floating gate on the tunnel dielectric; forming an insulation layer conformally disposed on the top surface and the sidewall surface of the floating gate; forming a control gate disposed on the insulation layer and the floating gate; and forming a spacer continuously distributed on the sidewall surfaces of the floating gate and the control gate, wherein the spacer overlaps portions of the top surface of the floating gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
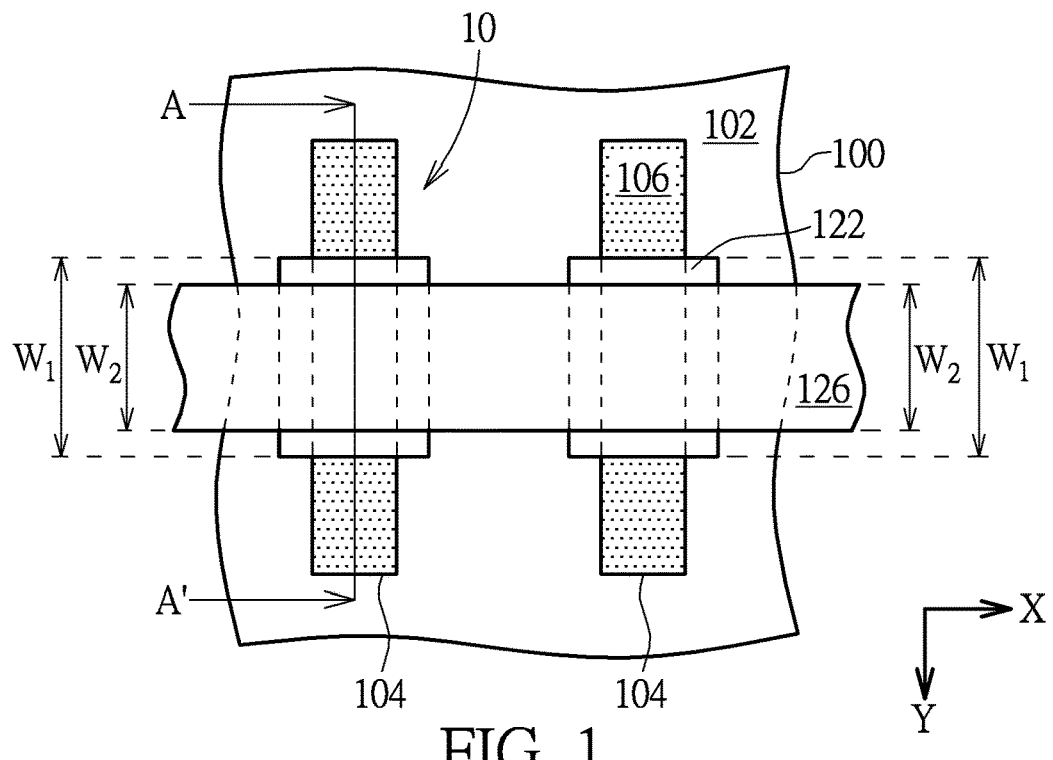
FIG. 1 is a schematic plan view of a semiconductor device according to an embodiment of the present invention.

Hereinafter, a semiconductor device and a method of fabricating the same according to the present invention will be described with reference to the drawings. The following embodiments are not to be taken in a limiting sense, and other embodiments may be modified by those skilled in the art without departing from the spirit and scope of the invention. Therefore, the scope of the present invention is defined only by the appended claims. Moreover, the details of some of the known structures will not be revealed here for the sake of simplicity and clarity. Wherein like reference numerals are used to refer to the same or the like elements throughout, and wherein the illustrated structures are not necessarily drawn to scale.

Figure 2:
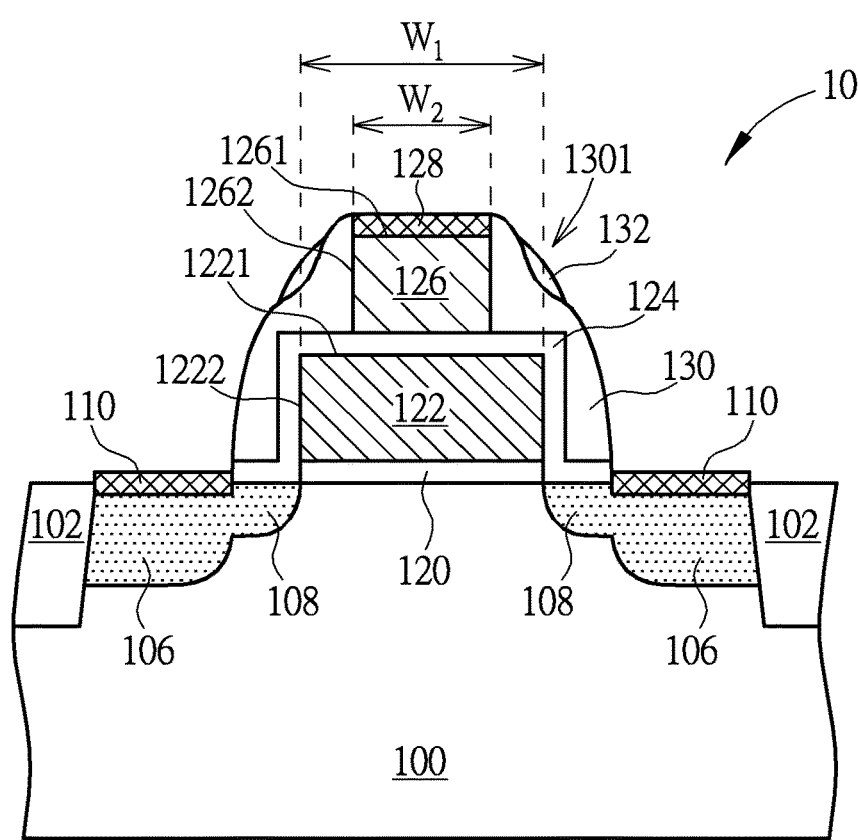
FIG. 2 is a schematic, cross-sectional diagram of a semiconductor device according to an embodiment of the present invention taken along line A-A' in FIG. 1.

Please refer to FIG. 1 and FIG. 2, FIG. 1 is a schematic plan view of a semiconductor device according to an embodiment of the present invention and FIG. 2 is a schematic, cross-sectional diagram of a semiconductor device according to an embodiment of the present invention taken along line A-A' in FIG. 1. According to an embodiment of the present invention, a semiconductor device includes at least a nonvolatile memory structure 10 such as erasable programmable read-only memory (EPROM) or electrically erasable programmable read-only memory (EEPROM), but is not limited thereto. According to the embodiment of the present invention, the nonvolatile memory structure 10 is a EEPROM including at least a semiconductor substrate 100, a tunnel dielectric 120, a floating gate 122, an insulation layer 124, a control gate 126, and a spacer 130. The details of the nonvolatile memory structure 10 are described below.

Specifically, the active region 104 of the nonvolatile memory structure 10 is disposed in the semiconductor substrate 100 and is defined by an insulating structure 102 embedded on the surface of the semiconductor substrate 100, for example, a shallow trench isolation (STI). A channel region, a heavily doped region (source/drain region) 106, and a lightly doped drain (LDD) region 108 are disposed in the active region 104, in which the channel region is located directly below the tunnel dielectric 120 and is located in the surface of the active region 104. The channel length of the channel region may be defined by two opposing LDD region 108.

The tunnel dielectric 120 is disposed on the semiconductor substrate 100, and the composition of the tunnel dielectric 120 is preferably an oxide, but is not limited thereto. For the nonvolatile memory structure 10 formed subsequently, electrons may penetrate through the tunnel dielectric 120 by applying an appropriate voltage. The floating gate 122 is disposed directly above the tunnel dielectric 120 and is made of a conductive material, such as polysilicon. The insulation layer 124 is conformally disposed on the top surface 1221 and the sidewall surface 1222 of the floating gate 122 and optionally further extends over the LDD region 108 within the active region 104. The insulation layer 124 may be a single layer structure, such as an oxide layer, or a multilayer stack structure such as a silicon oxide-silicon nitride-silicon oxide layer (referred to as ONO layer), but is not limited thereto. Preferably, the insulation layer 124 is a silicon oxide layer formed at a high temperature, and therefore has a dense structure. The control gate 126 is disposed on the floating gate 122 and the insulation layer 124, and the composition of the control gate 126 is a conductive material such as polysilicon.

A spacer 130 is disposed on at least one side of the floating gate 122 and the control gate 126 and the spacer 130 is continuously distributed on the sidewall surface 1222 of the floating gate 122 and the sidewall surface 1262 of the control gate 126 such that the spacer 130 overlaps portions of the top surface 1221 of the floating gate 122. In addition, the outside surface of the spacer 130 has a recess 1301, the totality of which is shown, for example in FIG. 2, to be vertically aligned with the totality of the control gate 126.

Furthermore, referring to the nonvolatile memory structure 10 of the embodiment shown in FIG. 1, each of the floating gates 122 may be disposed on the respective active regions 104, and the control gate 126 extends along a direction X and exhibits a line-like conductive layer so that the control gate 126 may simultaneously cover floating gates 122. Moreover, the widths of the floating gate 122 and the control gate 126 along a direction Y are different from each other. Preferably, the width $W_1$ of the floating gate 122 is greater than the width $W_2$ of the control gate 126. By the feature of such different widths, the coupling ratio of the nonvolatile memory structure 10 may be further enhanced, thereby reducing the operating voltage and power consumption of the nonvolatile memory structure 10 during operation.

In addition, the nonvolatile memory structure 10 may further include a silicide layer 110, 128 and a dielectric layer 132. The silicide layer 110 and the silicide layer 128 are disposed on the surface of the heavily doped region 106 and the top surface 1261 of the control gate 126, respectively. The dielectric layer 132 is disposed in the recess 1301 of the spacer 130 such that the portions of the surface of the spacer 130 is covered by the dielectric layer 132 while the other surfaces are exposed form the dielectric layer 132. Furthermore, the dielectric layer 132 may be further disposed in other regions of the semiconductor device, such as the peripheral region. The dielectric layer 132 disposed in the peripheral region may be a continuous layer that may be used to prevent the silicide layer from being formed in a particular region of the peripheral region. In other words, the dielectric layer 132 may be considered to be a patterned silicide block layer (SAB).

According to the above-mentioned embodiment, since the width $W_1$ of the floating gate 122 is greater than the width $W_2$ of the control gate 126, the coupling ratio of the nonvolatile memory structure 10 may be enhanced during the operation of the semiconductor device, thereby reducing the operating voltage and power consumption of the nonvolatile memory structure 10 during operation. In the following, a method for fabricating a semiconductor device is described in detail.

Figure 3:
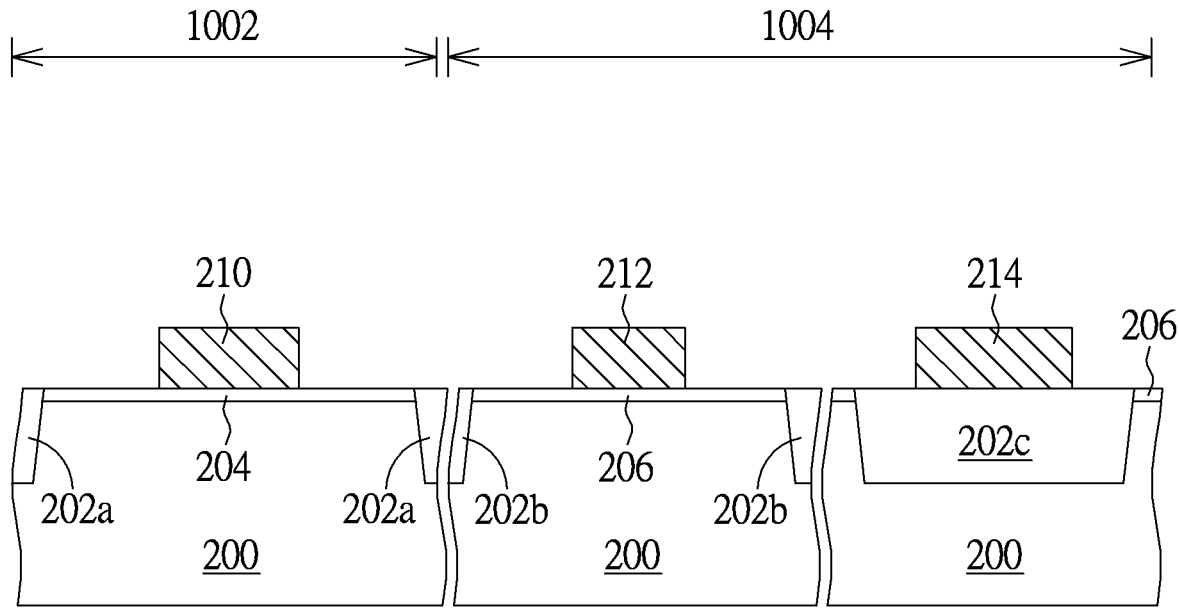
FIG. 3 is a schematic cross-sectional view of a semiconductor device according to an embodiment of the present invention at a certain process stage.

According to an embodiment of the present invention, a method for fabricating a semiconductor device 20 is provided. FIG. 3 is a schematic cross-sectional view of a semiconductor device according to an embodiment of the present invention at a certain process stage. As shown in FIG. 3, the semiconductor substrate 200 includes at least one cell region 1002 and at least one peripheral region 1004. The cell region 1002 is used to accommodate a nonvolatile memory such as EEPROM or flash memory while the peripheral region 1004 may be a logical region in which a transistor element for computing data may be provided. In this process stage, the insulating structure may be disposed in the semiconductor substrate 200 to electrically isolate the adjacent elements. For example, the insulating structure may be a shallow trench insulation structure 202a, 202b, 202c, and the shallow trench insulation structure 202a and the shallow trench insulation structures 202b, 202c may be disposed in the cell region 1002 and the peripheral region 1004, respectively.

The dielectric layer 204, 206, a floating gate 210, a gate electrode 212, and a resistor layer 214 may be disposed on the semiconductor substrate 200, where the dielectric layer 204 may serve as a tunneling dielectric of the memory structure and a dielectric layer 206 located below the gate electrode 212 may serve as a gate dielectric layer of the transistor structure. Depending on the process requirements, the main materials of the floating gate 210, the gate electrode 212 and the resistor layer 214 may be the same, such as polysilicon, but preferably have different doping concentrations and resistance values. For example, the doping concentrations of the floating gate 210 and the gate electrode 212 is preferably higher than the doping concentration of the resistor layer 214, so that the resistance of the floating gate 210 and the gate electrode 212 is lower than that of the resistor layer 214. The dielectric layers 204 and the dielectric layer 206 may have the same composition, such as an oxide layer, and the thicknesses of the dielectric layer 204 and the dielectric layer 206 may be adjusted depending on different requirements. For example, when the dielectric layer 206 serves as a gate dielectric layer of a high voltage transistor, the thickness of the dielectric layer 206 is thicker than the dielectric layer 204 used in the memory structure.

It should be noted that some steps for fabricating the floating gate 210, the gate electrode 212 and the resistor layer 214 may be integrated together. For example, the process may include depositing a semiconductor layer, such as an undoped polysilicon layer, in the cell region 1002 and the peripheral region 1004 of the semiconductor substrate 200. Thereafter, a photolithography and etching process is performed to the semiconductor layer to fabricate a patterned structures respectively disposed in the cell region 1002 and the peripheral region 1004. Next, the ion implantation process is optionally performed to the patterned structures in the particular region, such as the cell region 1002, to reduce the resistance of the patterned structures in a particular region. The patterned structures described above may correspond to the floating gate 210, the gate electrode 212, and the resistor layer 214 of the semiconductor device 20, respectively.

Figure 4:
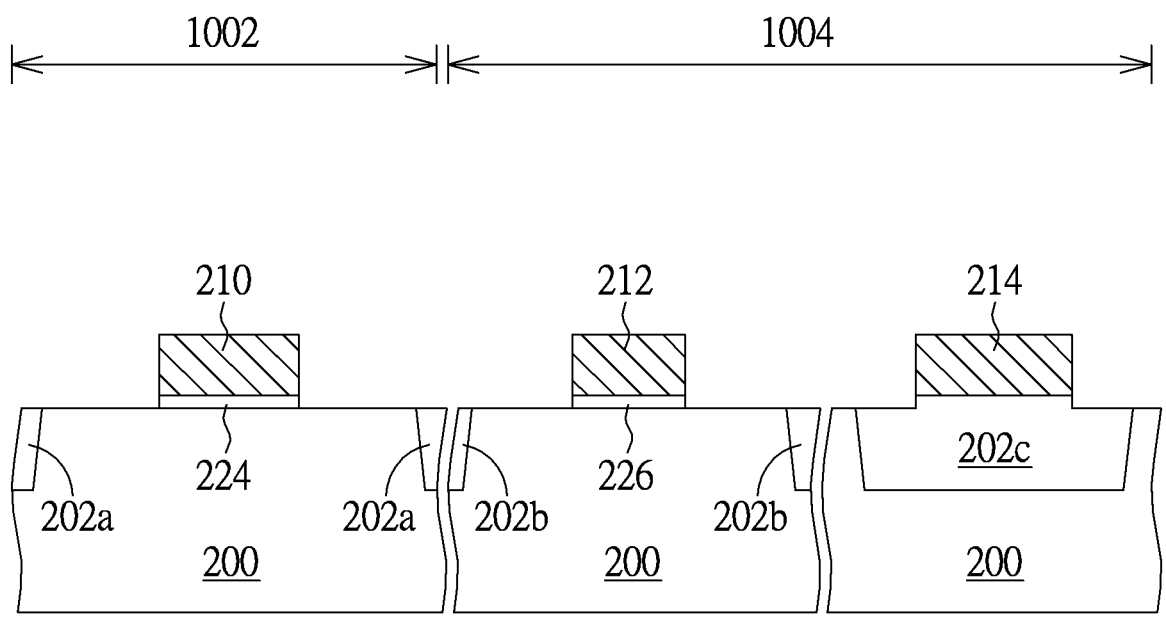
FIG. 4 is a schematic cross-sectional view of a semiconductor device according to an embodiment of the present invention after an etching process is performed.

Next, an anisotropic etching process is performed to etch the dielectric layers 204 and 206 which are not covered by the floating gate 210, the gate electrode 212, and the resistor layer 214 under a masking of the floating gate 210, the gate electrode 212, and the resistor layer 214, thereby forming a structure shown in FIG. 4. FIG. 4 is a schematic cross-sectional view of a semiconductor device according to an embodiment of the present invention after an etching process is performed. Specifically, the dielectric layer 204 and the dielectric layer 206, respectively, located below the floating gate 210 and the gate electrode 212 may be patterned simultaneously to form a tunnel dielectric 224 and a gate dielectric layer 226.

Figure 5:
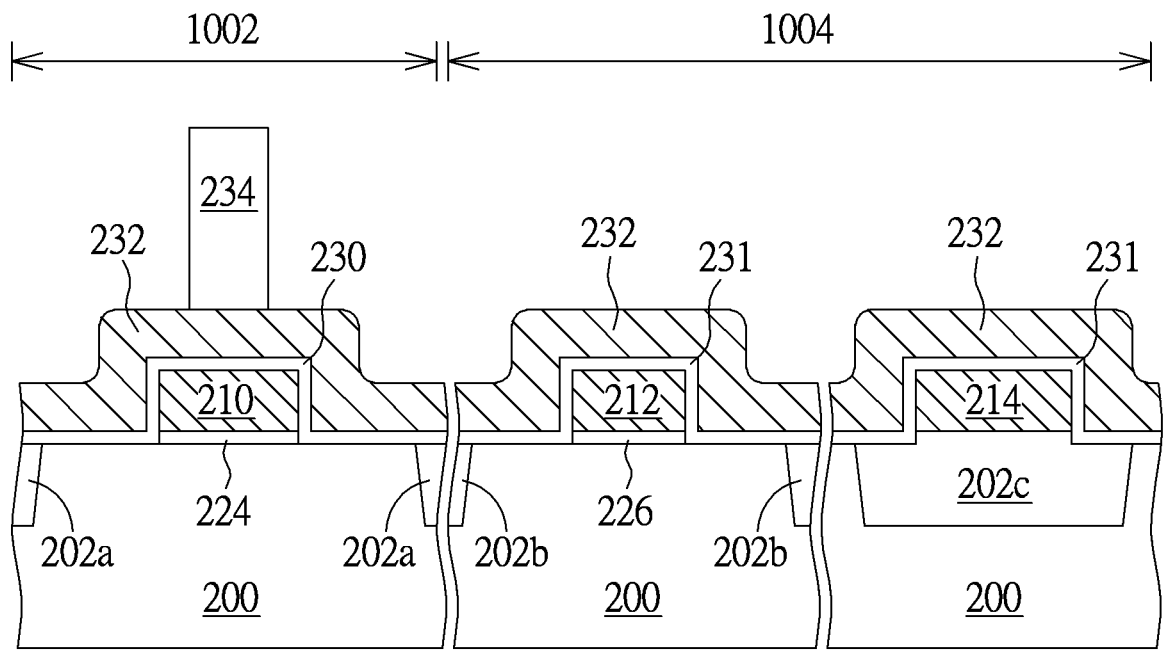
FIG. 5 is a schematic cross-sectional view of a semiconductor device according to an embodiment of the present invention after the insulation layer and the conductive layer are sequentially deposited.

FIG. 5 is a schematic cross-sectional view of a semiconductor device according to an embodiment of the present invention after the insulation layer and the conductive layer are sequentially deposited. Next, a thermal oxidation process or a deposition process may be used to conformally cover an insulation layer 230, 231 on the surface of the floating gate 210, the gate electrode 212 and the resistor layer 214, such as an oxide layer or a silicon oxide-silicon nitride-silicon oxide layer (referred to as ONO layer). It should be noted that, in the case where the insulation layers 230 and 231 are both oxide layers, since the doped regions are not disposed in the semiconductor substrate 200 during the preparation of the insulation layers 230 and 231, the insulation layer 230 may be formed at a relatively high process temperature, thereby the insulation layer 230 has a dense structure. Moreover, in the case where the insulation layer 230 is an ONO layer, the insulation layer 231 located in the peripheral region 1004 is preferably an oxide layer and is not an ONO layer. Thereafter, a conductive layer 232 is formed to cover the floating gate 210, the gate electrode 212, and the resistor layer 214, in which the material of the conductive layer 232 is preferably polysilicon, but is not limited thereto. Next, an etch mask 234, such as a photoresist layer, is formed on the conductive layer 232 of the cell region 1002, which is used to define the position of the control gate of the memory structure. Subsequently, an etching process is performed to further pattern the conductive layer 232 by the etch mask 234. Finally, the etch mask 234 is removed.

Figure 6:
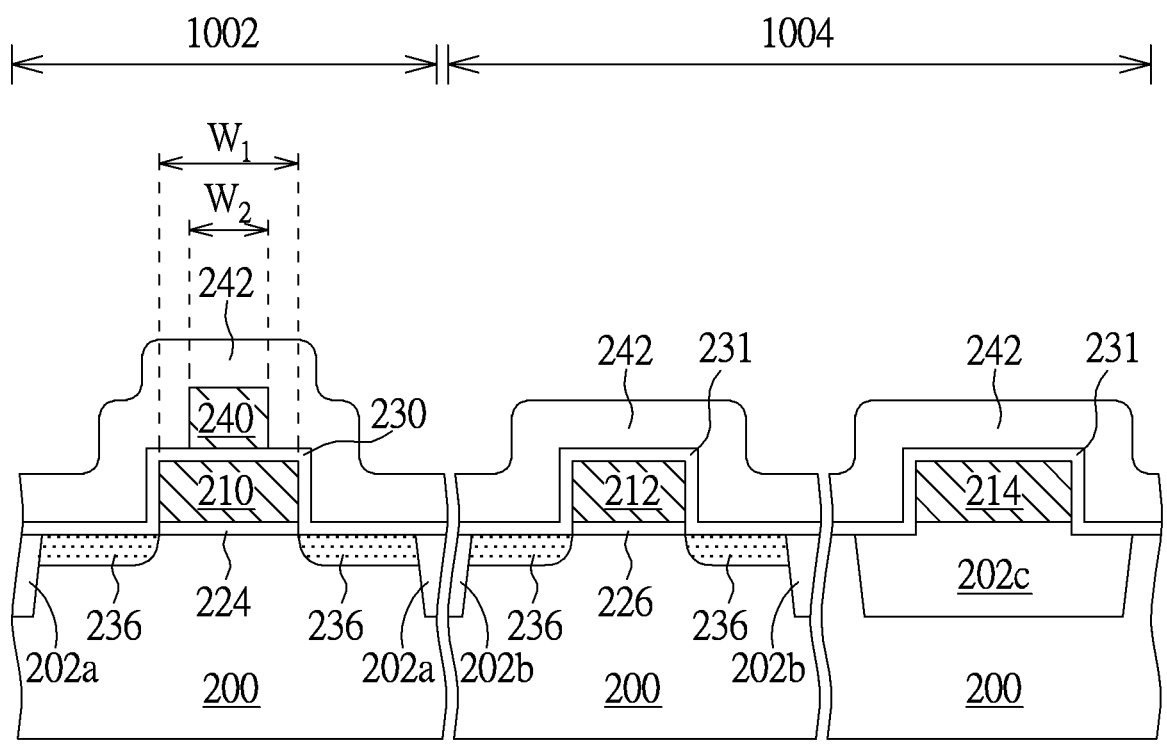
FIG. 6 is a schematic cross-sectional view of a semiconductor device according to an embodiment of the present invention after forming a spacer layer.

FIG. 6 is a schematic cross-sectional view of a semiconductor device according to an embodiment of the present invention after forming a spacer layer. When the process shown in FIG. 5 is completed, the control gate 240 may be defined on the floating gate 210 and the width $W_1$ of the floating gate 210 is preferably greater than the width $W_2$ of the control gate 240. The ion implantation process may be performed under the cover of the floating gate 210, the gate electrode 212 and the resistor layer 214 to simultaneously form a LDD region 236 in the semiconductor substrate 200 of the cell region 1002 and the peripheral region 1004. A spacer layer 242 is then conformally deposited to cover the floating gate 210, the control gate 240, the gate electrode 212, and the resistor layer 214. The spacer layer 242 may be a single layer structure or a composite layer structure, and it may be formed by one or more deposition processes. Next, an anisotropic etching process may be performed to etch the spacer layer 242 until a desired spacer is formed.

Figure 7:
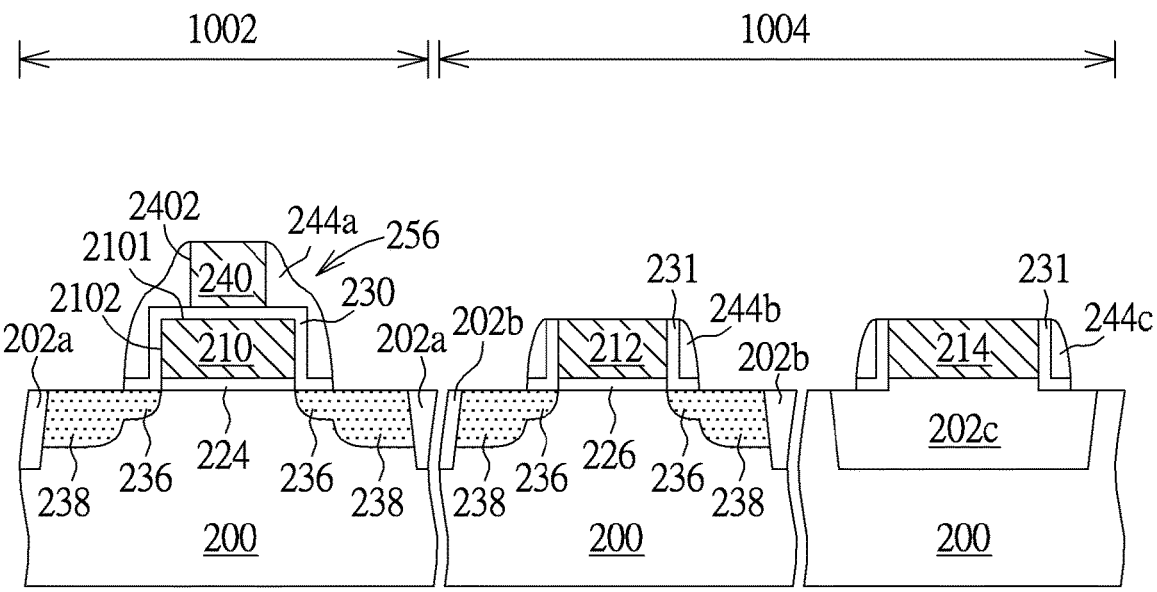
FIG. 7 is a schematic cross-sectional view of a semiconductor device according to an embodiment of the present invention after forming a spacer layer.

FIG. 7 is a schematic cross-sectional view of a semiconductor device according to an embodiment of the present invention after forming a spacer layer. When the process shown in FIG. 6 is completed, the spacers 244a, 244b and 244c are formed on the sidewall surfaces of the floating gate 210, the control gate 240, the gate electrode 212, and the resistor layer 214. The spacer 244a not only covers the sidewall surface 2402 of the control gate 240 but also covers the top surface 2101 and the sidewall surface 2102 of the floating gate 210. In other words, the spacer 244a may overlap portions of the top surface 2101 of the floating gate 210, and continuously distribute on the sidewall surface 2102 of the floating gate 210 and the sidewall surface 2402 of the control gate 240. Moreover, since the sidewall surface 2402 of the control gate 240 is retracted from the sidewall surface 2102 of the floating gate 210, the spacer 244a located on the sidewall surface 2402 of the control gate 240 is relatively retracted and has a recess 256 on the surface of the spacer 244a.

Next, an ion implantation process is performed under the cover of the floating gate 210, the control gate 240, the gate electrode 212, the resistor layer 214, and the spacers 244a, 244b, 244c so as to form a heavily doped region 238 as source/drain region.

Figure 8:
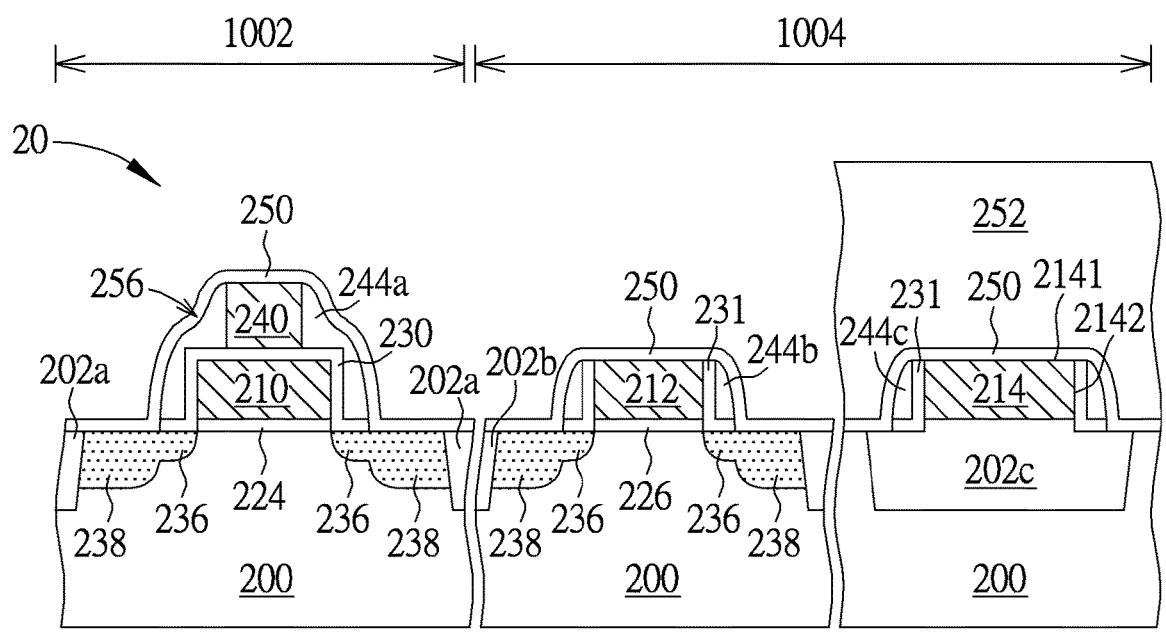
FIG. 8 is a schematic cross-sectional view of a semiconductor device according to an embodiment of the present invention after forming a mask layer.

FIG. 8 is a schematic cross-sectional view of a semiconductor device according to an embodiment of the present invention after forming a mask layer. Next, a dielectric layer 250 is conformally deposited to cover the control gate 240, the gate electrode 212, the resistor layer 214, and the spacers 244a, 244b, 244c. The dielectric layer 250 may be a silicon nitride layer or other suitable dielectric layer, which may be used to prevent the formation of the silicide in a particular region in the subsequent self-aligned silicidation process (salicide). Next, an etch mask 252, such as a photoresist layer, is formed to cover the resistor layer 214 of the peripheral region 1004 and the dielectric layer 250 thereon. An etching process is then performed to etch the dielectric layer 250 by the etch mask 252. Thereafter, the etch mask 252 is removed.

Figure 9:
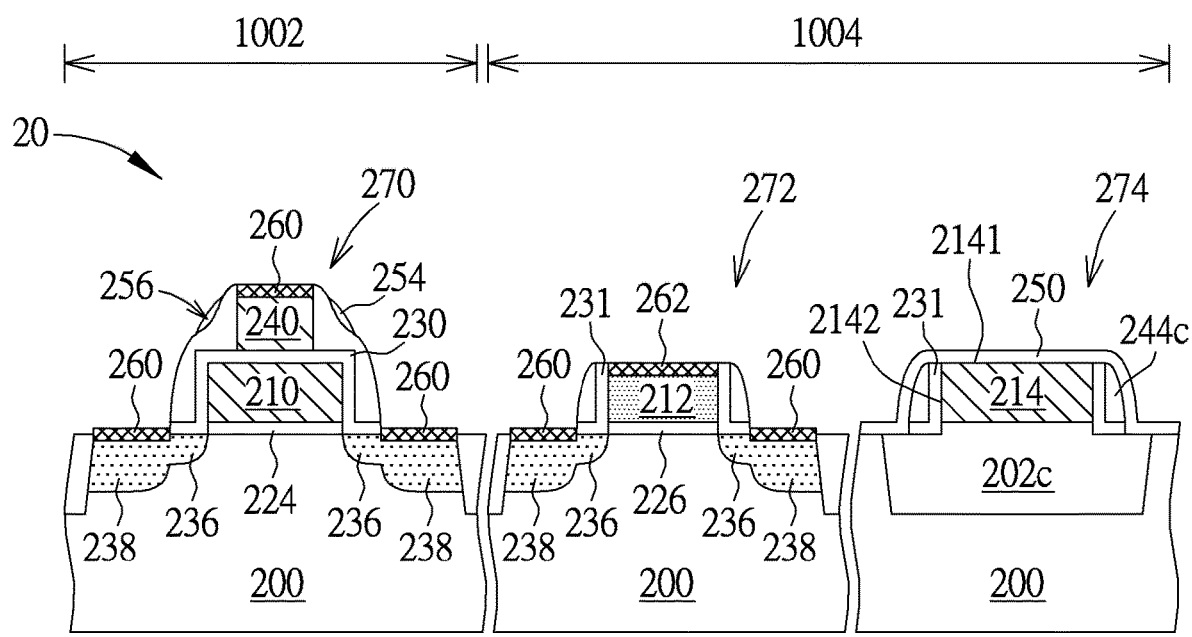
FIG. 9 is a schematic cross-sectional view of a semiconductor device according to an embodiment of the present invention after forming a silicide.

FIG. 9 is a schematic cross-sectional view of a semiconductor device according to an embodiment of the present invention after forming a silicide. When the process shown in FIG. 8 is completed, the resistor layer 214 in the peripheral region 1004 is still covered by the dielectric layer 250. In contrast, the dielectric layer 250 that originally covered the control gate 240 is completely removed. In addition, the dielectric layer 250 originally located in the cell region 1002 is partially etched thereby forming a patterned dielectric layer 254 in the recess 256. Thereafter, a self-aligned silicidation process is performed under the cover of the dielectric layers 250, 254, thereby forming silicides 260,262 on the exposed surface of the heavily doped regions 236, 238, the top surface of the control gate 240 and the top surface of the gate electrode 212. It should be noted that the top surface 2141 and the sidewall surface 2142 of the resistor layer 214 of the peripheral region 1004 are still covered by the dielectric layer 250 during the self-aligned silicidation process such that the silicide is not formed in the resistor layer 214.

According to this embodiment, the semiconductor device 20 includes at least a memory device 270, a gate structure 272, and a resistor structure 274. The structure of the memory device 270 is similar to that of the embodiment shown in FIG. 2, and will not be described again. The gate structure 272 includes a gate electrode 212, a gate dielectric layer 226, and a silicide 262, which may serve as components of a logic transistor. The resistor structure 274 may be a resistor layer 214 that may be used to lower the voltage so that the logic transistor in the peripheral region can operate at an appropriate voltage.

Figure 10:
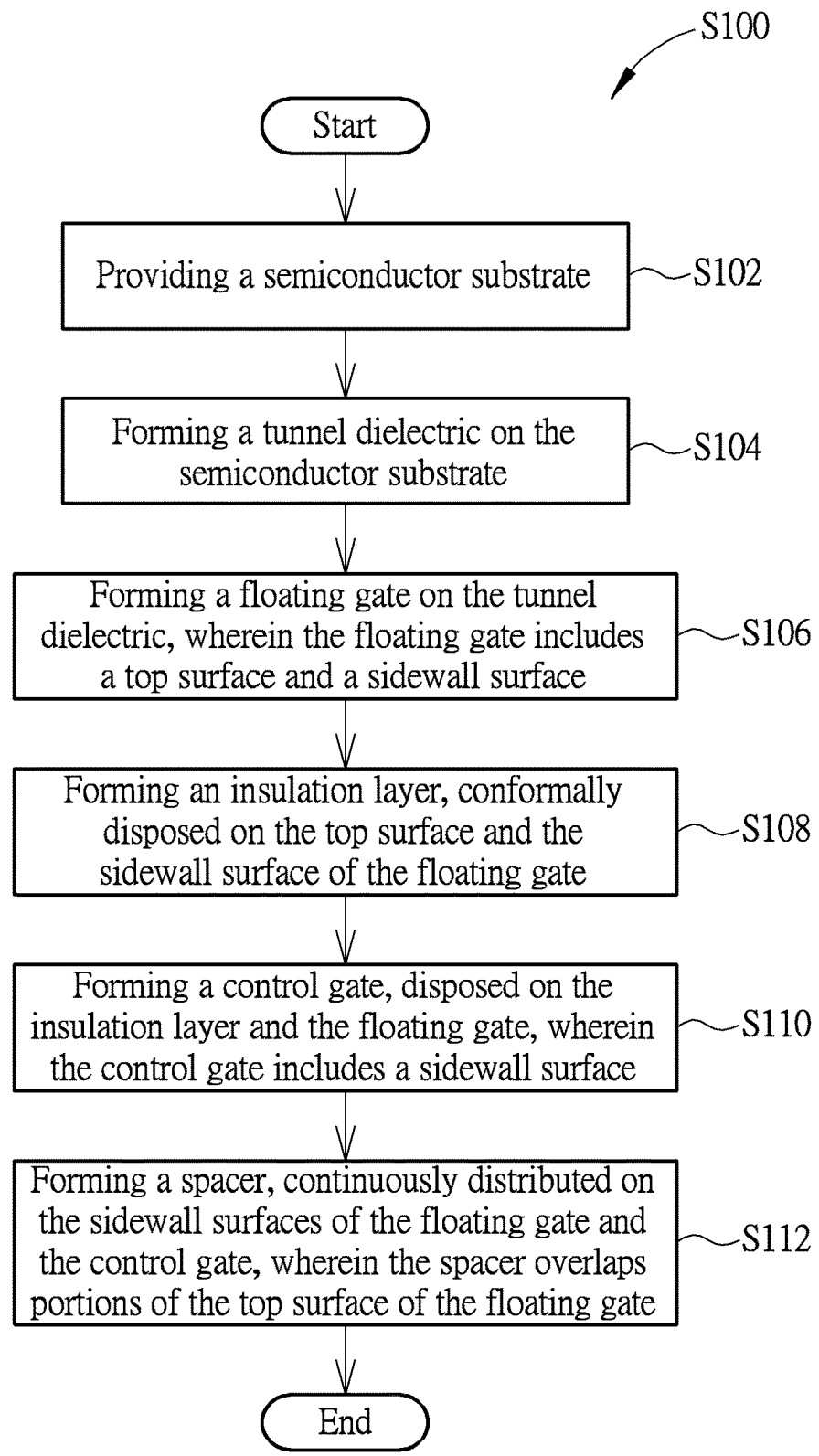
FIG. 10 is a flow chart showing the fabrication of a semiconductor device according to an embodiment of the present invention.

FIG. 10 is a flow chart showing the fabrication of a semiconductor device according to an embodiment of the present invention. According to an embodiment of the present invention, the method S100 includes following steps:

Step S102: providing a semiconductor substrate;

Step S104: forming a tunnel dielectric on the semiconductor substrate;

Step S106: forming a floating gate on the tunnel dielectric, wherein the floating gate includes a top surface and a sidewall surface;

Step S108: forming an insulation layer, conformally disposed on the top surface and the sidewall surface of the floating gate;

Step S110: forming a control gate, disposed on the insulation layer and the floating gate, wherein the control gate includes a sidewall surface; and Step S112: forming a spacer, continuously distributed on the sidewall surfaces of the floating gate and the control gate, wherein the spacer overlaps portions of the top surface of the floating gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a semiconductor substrate; forming a tunnel dielectric on the semiconductor substrate;
   forming a floating gate on the tunnel dielectric, wherein the floating gate comprises a top surface and a sidewall surface;
   forming an insulation layer, conformally disposed on the top surface and the sidewall surface of the floating gate;
   forming a control gate, disposed on the insulation layer and the floating gate, wherein the control gate comprises a sidewall surface; and
   forming a spacer, continuously distributed on the sidewall surfaces of the floating gate and the control gate,
   wherein the spacer overlaps portions of the top surface of the floating gate, wherein a side surface of the spacer comprises a recess, and a totality of the recess is vertically aligned with a totality of the control gate, and the totality of the recess is vertically above a totality of the floating gate.

2. The method for fabricating the semiconductor device of claim 1, wherein the floating gate and the control gate respectively comprise a width, the widths are parallel to an orientation, the width of the floating gate is greater than the width of the control gate.

3. The method for fabricating the semiconductor device of claim 1, wherein the semiconductor substrate comprises a cell region and a peripheral region, the method further comprises:
   depositing a semiconductor layer on the semiconductor substrate, the semiconductor layer is disposed in the cell region and the peripheral region; and
   patterning the semiconductor layer to fabricate a plurality of patterned structures, the patterned structures are respectively disposed in the cell region and the peripheral region, wherein the patterned structure in the cell region is a floating gate, the patterned structures in the peripheral region are respectively a gate electrode and a resistor layer.

4. The method for fabricating the semiconductor device of claim 3, further comprising forming the insulation layer to conformally cover the gate electrode and the resistor layer.

5. The method for fabricating the semiconductor device of claim 3, after forming the control gate, the method further comprising:
   forming a spacer layer, covering the control gate, the gate electrode and the resistor layer; and
   etching the spacer layer by an anisotropic etching process so as to concurrently fabricate the spacer and a plurality of further spacers, wherein the further spacers are respectively disposed on a sidewall surfaces of the gate electrode and the resistor layer.

6. The method for fabricating the semiconductor device of claim 5, after forming the spacer, the method further comprising:
   forming a dielectric layer, covering the control gate, the gate electrode and the resistor layer;
   forming an etch mask to cover the dielectric layer disposed on the resistor layer and to cover the resistor layer; and
   performing an anisotropic etching process to completely remove the dielectric layer covering disposed over the gate electrode, wherein the dielectric layer disposed on the resistor layer and the resistor layer are covered with the etch mask during the anisotropic etching process.

7. The method for fabricating the semiconductor device of claim 6, further comprising:
   removing the etch mask; and
   performing a self-aligned silicidation process under the protection of the dielectric layer to concurrently form silicides on portions of a surface of the semiconductor substrate and on the top surface of the control gate.

* * * * *